United States Patent [19]

Hsue et al.

[11] Patent Number: 5,506,438
[45] Date of Patent: Apr. 9, 1996

[54] SEMICONDUCTOR DEVICE WITH TWO DIFFERENT THRESHOLD VOLTAGES

[75] Inventors: Chen-Chiu Hsue; Sun-Chieh Chien, both of Hsin-Chu; Lee C. Yuan, Chung-Li; Tzong-Shien Wu, Hsin-Chu, all of Taiwan

[73] Assignee: United Microelectronics Corporation, Hsin-chu, Taiwan

[21] Appl. No.: 387,434

[22] Filed: Feb. 13, 1995

Related U.S. Application Data

[62] Division of Ser. No. 249,307, May 24, 1994, Pat. No. 5,416,038.

[51] Int. Cl.$^6$ ............................. H01L 29/76; H01L 29/94
[52] U.S. Cl. ........................ 257/376; 257/372; 257/371
[58] Field of Search ........................ 257/378, 371, 257/372, 376, 392, 373, 391, 398, 399, 400

[56] References Cited

U.S. PATENT DOCUMENTS

| | | | |
|---|---|---|---|
| 4,613,885 | 9/1986 | Haken | 257/372 |
| 4,716,451 | 12/1987 | Hsu et al. | 257/376 |

*Primary Examiner*—Wael M. Fahmy
*Attorney, Agent, or Firm*—George O. Saile; Jerry Jones

[57] ABSTRACT

A semiconductor MOSFET device manufactured by a process starting with a doped semiconductor substrate with a P-well and an N-well and field oxide structures on the surface of the P-well and the N-well separating the surfaces of the P-well and the N-well into separate regions and a silicon dioxide film on the remainder of the surface of the P-well and the N-well comprising the steps as follows: forming a mask over the N-well and an under sized mask over one of the separate regions of the P-well performing a field ion implantation of $V_t'$ ions into the P-well, removing the mask over the portion of the P-well, performing a blanket ion implantation of $V_{t1}$ ions over the entire device.

20 Claims, 7 Drawing Sheets

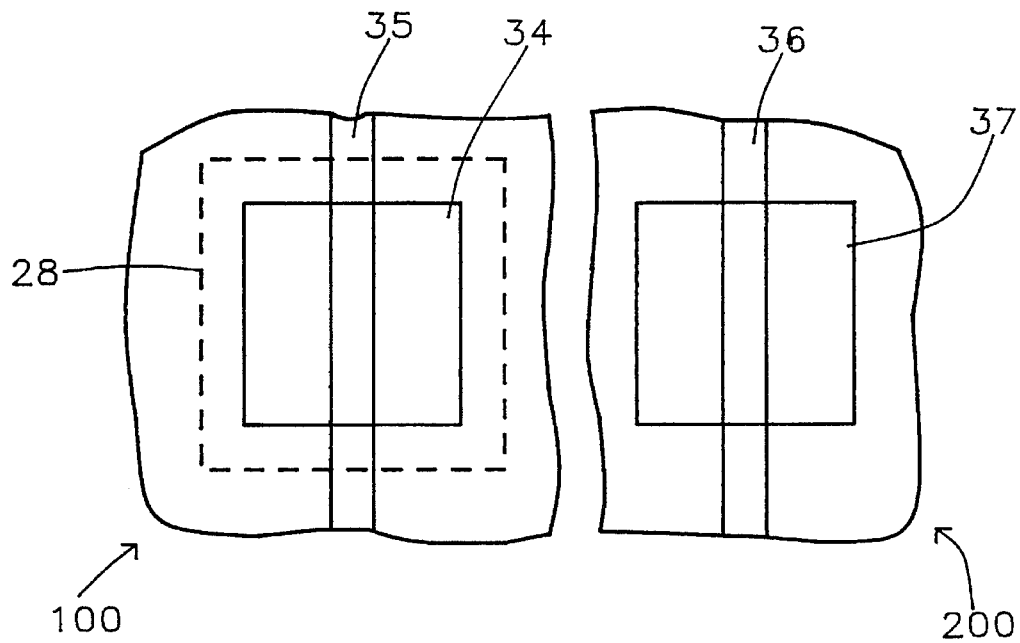
FIG. 1A Prior Art
FIG. 1B Prior Art
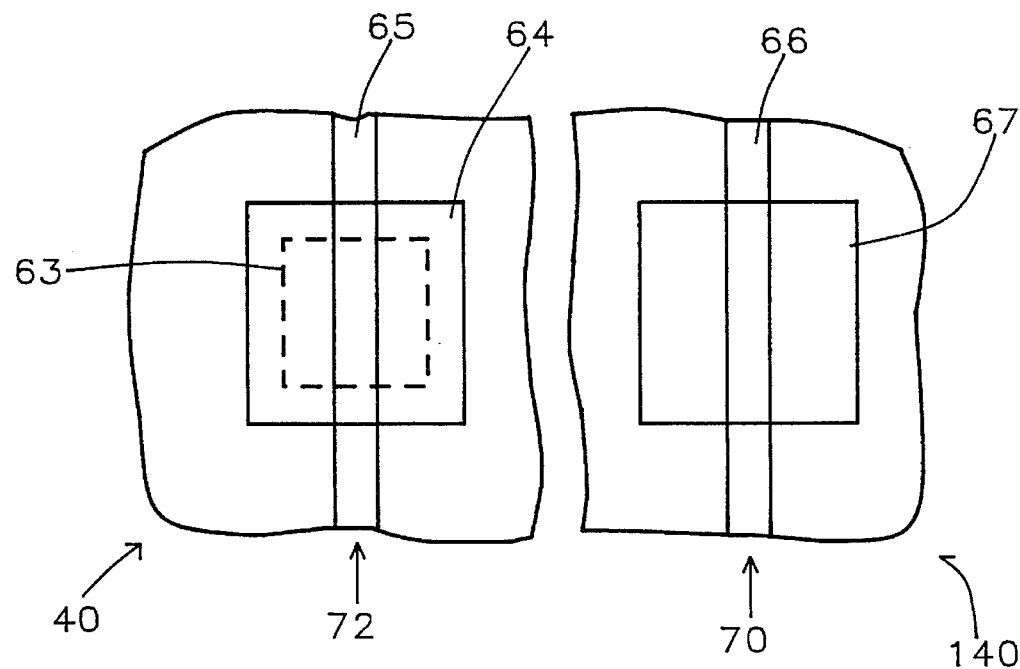
FIG. 2A Prior Art
FIG. 2B Prior Art

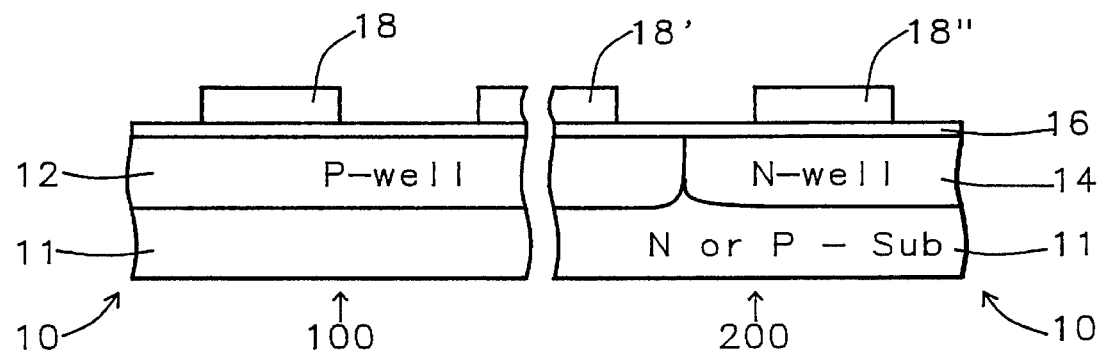
*FIG. 3A*  *FIG. 3B*
*Prior Art*  *Prior Art*
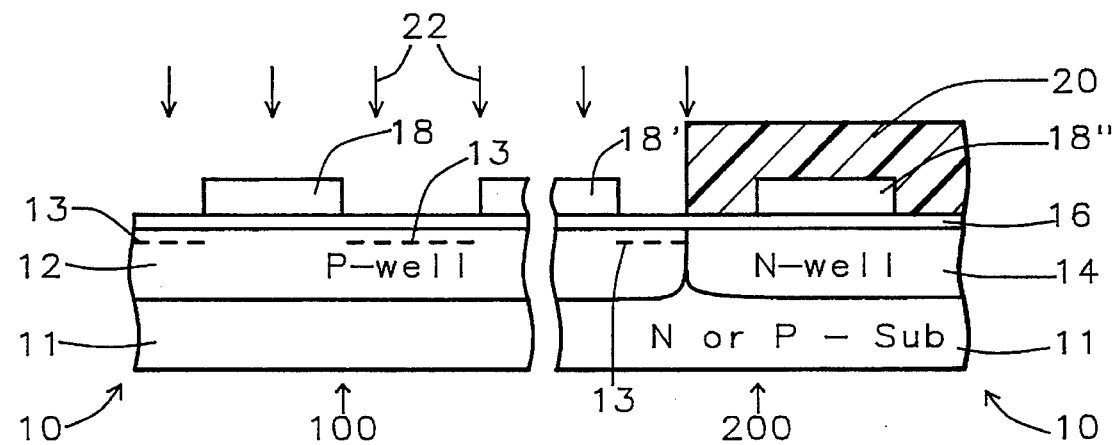
*FIG. 3C*  *FIG. 3D*
*Prior Art*  *Prior Art*

Prior Art   Prior Art

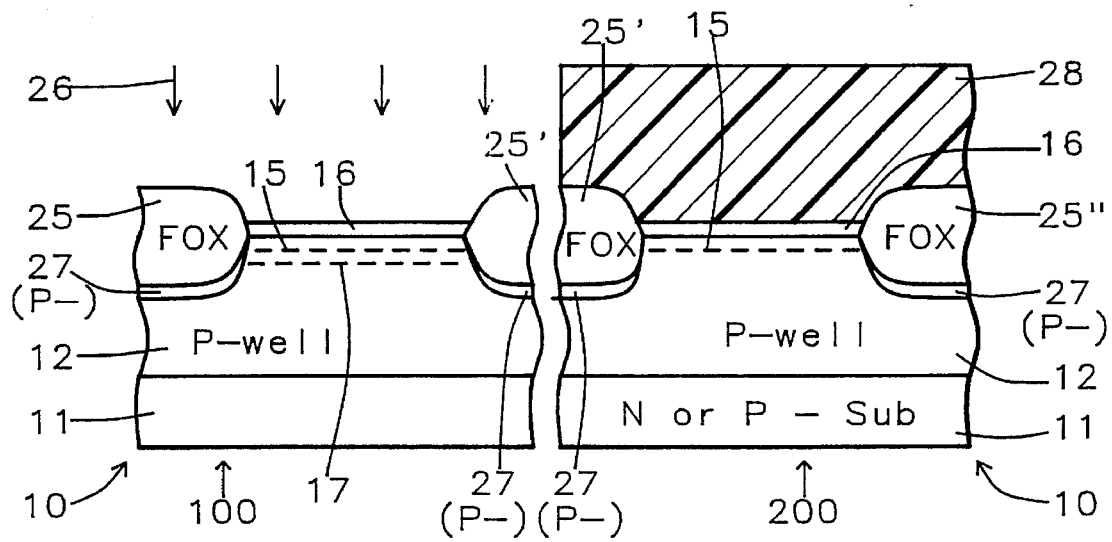
FIG. 3G Prior Art    FIG. 3H Prior Art
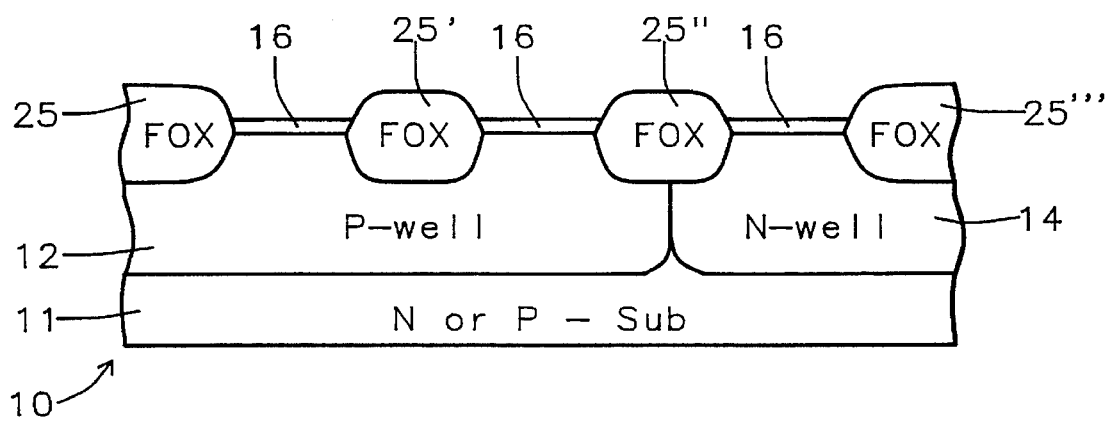
FIG. 4A – Prior Art

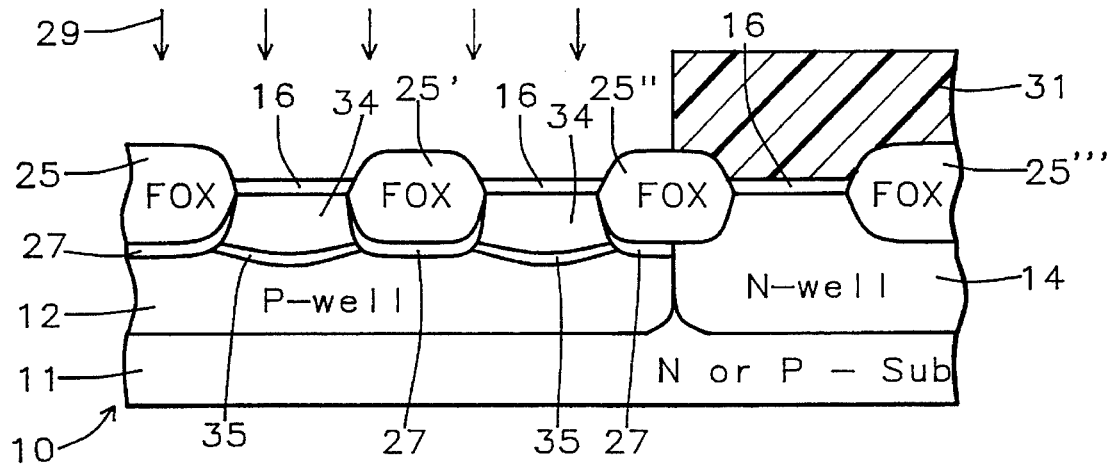
FIG. 4B — Prior Art
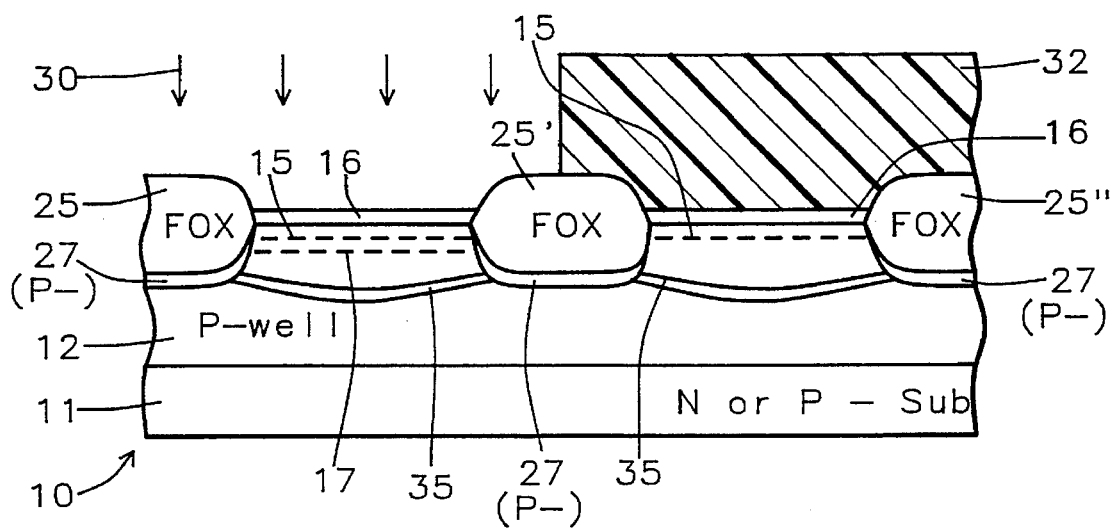
FIG. 4C — Prior Art

SEMICONDUCTOR DEVICE WITH TWO DIFFERENT THRESHOLD VOLTAGES

This application is a division of U.S. patent application Ser. No. 08/249,307, filed May 24, 1994, now U.S. Pat. No. 5,416,038.

BACKGROUND OF THE INVENTION

1. Field of the Invention

This invention relates to manufacture of a MOSFET device and more particularly to improved channel doping.

2. Description of Related Art

For circuit performance optimization, a different threshold voltage $V_t$ or different channel doping is required. In general, one extra mask is required to implement such circuit performance optimization.

FIG. 1A shows a prior art device 100 with a Vt' mask 28 and an active area 34 with a polysilicon gate 35. FIG. 1B shows a prior art device 200 with an active area 37 with another polysilicon gate 36. In FIGS. 1A and 1B an aspect of a typical prior art process for getting a different $V_t$ is illustrated. Device 200 is a normal device with threshold voltage $V_{t1}$ and device 100 is another device with a threshold voltage $V_{t2}$, $V_{t1} \neq V_{t2}$. In general device 100 needs an extra $V_t'$ mask 28 and ion implantation to get a different $V_t$ as provided with device 200.

FIGS. 3A to 3H show cross sectional views of a prior art process of fabrication of a semiconductor device on a silicon substrate 10 in which a P-well 12 and an N-well 14 in an N or P-sub 11 have been formed by a conventional process, with only the P-well 12 shown in FIGS. 3F and 3H.

Referring to FIGS. 3A AND 3B, a blanket silicon dioxide (Pad oxide) layer 16 is deposited over the entire device followed by a silicon nitride ($Si_3N_4$) layer (18, 18', 18" which silicon nitride layer is patterned into $Si_3N_4$ structures 18, 18', 18" to be used as a mask in forming active layer patterning.

In FIGS. 3C and 3D, a photoresist mask 20 has been formed over the N-well 14 portions of the product of FIGS. 3A and 3B, and then a NMOS field implantation of ions 22 is made in the P-well 12 producing dopant 13 in the surface of the P-well 12 aside from the $Si_3N_4$ structures 18 and 18'.

In FIGS. 3E and 3F, a device similar to that in FIGS. 3C and 3D is shown with a slightly different scale, after the photoresist mask 20 has been removed. A field oxidation process is performed producing FOX structures 25, 25', 25" followed by stripping of the remaining portions of the silicon nitride layer 18, 18', 18" on the surface of the device. Then a $V_{t1}$ blanket ion implantation with ions 24 is performed producing dopant 15 in the surface of the P-well 12 between the FOX structures 25, 25', 25". There are P-regions 27 beneath FOX structures 25, 25', 25" formed during ion implantation 22 and field oxidation step.

In FIGS. 3G and 3H, the product of FIGS. 3E and 3F is covered with a $V_t'$ photoresist mask 28 on the right side leaving the space between one pair of FOX structures 25, 25' exposed and the other space between FOX structures 25', 25" covered. The exposed region between FOX structures 25 and 25' is then implanted with a $V_t'$ ion implant of ions 26 yielding a $V_t$ dose of ions 17 where $V_{t2}=V_{t1}+V_t'$, which is greater than $V_{t1}$ which is the value for the ions 15 under the second photoresist layer.

The photoresist mask 28 is then removed. Then the conventional process is followed including the polysilicon gate CMOS process, PAD oxide 16 is removed, gate oxidation, polysilicon gate definition, source/drain implant and backend process contact, metallization, passivation, etc. as is well known by those skilled in the art.

FIGS. 4A–4C show cross sectional views of another prior art process of fabrication of another semiconductor device. In FIGS. 4A and 4B, a P-well 12 and an N-well 14 have been formed by a conventional process, whereas in FIG. 4C, the N-well is absent from the view which is of larger scale.

FIG. 4A shows a substrate 10 with an N or P-sub 11, a P-well 12 and an N-well 14 formed by a conventional process and a field oxidation process has been performed leaving FOX structures 25, 25', 25" and 25'''. The structure is covered with gate oxide layer 16 between the FOX structures 25, 25', 25" and 25'''.

In FIG. 4B, a photoresist mask 31 has been formed over the N-well 14 portions of the product of FIG. 4A, and then a field implantation of B11 ions 29 at between about 120 keV and 200 keV is made into the P-well 12 leaving a dose of ions 27 under FOX structures 25, 25' and part of FOX structure 25" and ions 35 between FOX structures 25 and 25' and between structures 25' and 25".

In FIG. 4C, the N-well 14 is absent from the view which is of a larger scale with the thickness retained low for convenience of illustration. The product of FIG. 4C has a $V_{t1}$ blanket ion implantation 15 Performed thereon. Next the device in FIG. 4C is covered with a $V_t$ photoresist 32 on the right side leaving the space between one pair of FOX structures 25 and 25' exposed and the other space between FOX structures 25' and 25" covered. The exposed region is then implanted with a $V_t'$ion implant of ions 30 yielding a $V_t$ dose of ions 15 and 17 where $V_t=V_{t1}+V_t'$, which is greater than $V_{t1}$ which is the value under the second photoresist layer 32 between FOX structures 25' and 25".

The photoresist mask 32 is then removed, leaving the silicon dioxide gate oxide layer 16 above the region of P-well 12 containing Vt' ions 15 between FOX regions 25' and 25".

The photoresist mask 32 is then removed. Then the conventional process is followed including the polysilicon gate CMOS process, PAD oxide 16 is removed, gate oxidation, polysilicon gate definition, source/drain implant and backend process contact, metallization, passivation, etc. as is well known by those skilled in the art.

SUMMARY OF THE INVENTION

An object of this invention, is to obtain different threshold voltages $V_T$ with a process which does not include the extra masking step of the prior art to provide a process which is simple and cost effective.

A semiconductor MOSFET device manufactured by a process starting with a doped semiconductor substrate with a P-well and an N-well and field oxide structures on the surface of the P-well and the N-well separating the surfaces of the P-well and the N-well into separate regions and a silicon dioxide film on the remainder of the surface of the P-well and the N-well comprising the steps as follows: forming a mask over the N-well and an under sized mask over one of the separate regions of the P-well performing a field ion implantation and ion implantation of $V_t'$ ions into the P-well, removing the mask over the portion of the P-well, performing a blanket ion implantation of $V_{t1}$ ions over the entire device.

Preferably, the $V_t'$ ion implant dopant selected from the group consisting of $B^{11}$ and $BF_2$ is applied at a range of energies from about 10 keV to about 80 keV is possible with a range of doses from about 5×10E11 cm$^{-2}$ to about 5×10E12 cm$^{-2}$.

Preferably, the $V_{t1}$ ion implant dopant selected from the group consisting of B$^{11}$ and BF$_2$ is applied at a range of energies from about 10 keV to about 80 keV, with a range of doses from about 8×10E11 cm$^{-2}$ to about 5×10E12 cm$^{-2}$.

Preferably, the $V_{t1}$ ion implant dopant selected from the group consisting of P$^{31}$ and As+ is applied at a range of energies from about 30 keV to about 120 keV, with a range of doses from about 5×10E11 cm$^{-2}$ to about 5×10E12.

Preferably, the field implant comprises B$^{11}$ dopant is applied at a range of energies from about 120 keV to about 200 keV.

It is further preferred that the mask is formed over a portion of the separate region leaving the periphery of the one separate region exposed.

BRIEF DESCRIPTION OF THE DRAWINGS

The foregoing and other aspects and advantages of this invention are explained and described below with reference to the accompanying drawings, in which:

FIG. 1A shows a prior art device with a Vt' mask and an active area with a polysilicon gate.

FIG. 1B a shows a prior art device 200 with an active area with another polysilicon gate.

FIGS. 2A and 2B show devices in accordance with this invention including a semiconductor substrate with a field implant mask (or Vt' mask) and an active area with a polysilicon gate.

FIGS. 3A to 3H show cross sectional views of a prior art process of fabrication of a semiconductor device on a silicon substrate in which a P-well and an N-well in an N or P-sub have been formed by a conventional process, with only the P-well shown in FIGS. 3E, 3F, 3G and 3H.

FIGS. 4A–4C show cross sectional views of another prior art process of fabrication of another semiconductor device.

DESCRIPTION OF THE PREFERRED EMBODIMENT

Figures 3E, 3F:
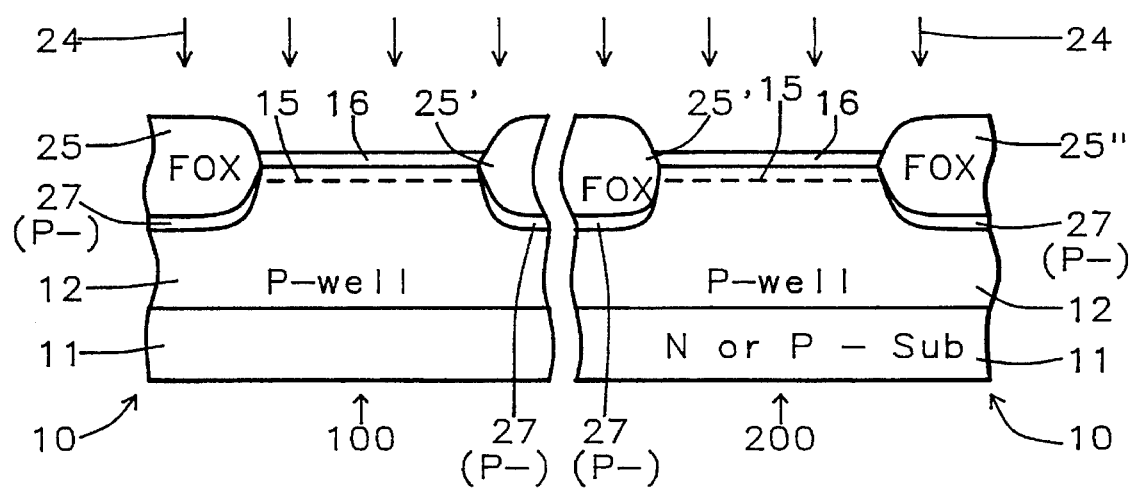

With the process changes and layout modifications in accordance with this invention, different threshold voltages $V_T$ are achieved without the extra masking step of the prior art. Accordingly the process is simplified and cost effective.

The field implant mask (such as mask 63 in FIG. 5B, described below) is under sized to address the field leakage issue. The active edge should be covered by field implantation, otherwise there would be a leakage path passing through the field edge without covering the field implant region (such as FIG. 6A described below).

FIGS. 2A and 2B show devices in accordance with this invention including a semiconductor substrate with a field implant mask (or Vt' mask) and an active area with a polysilicon gate.

FIGS. 2A shows a device 40 including a semiconductor substrate with a different field implant mask 63 (or Vt' mask) as described above in connection with FIG. 1A and an active area 64 with a polysilicon gate 68.

FIG. 2B shows a device 140 including a semiconductor substrate without a field implant mask (or Vt' mask) and an active area 67 with a polysilicon gate 66.

Figure 5A:
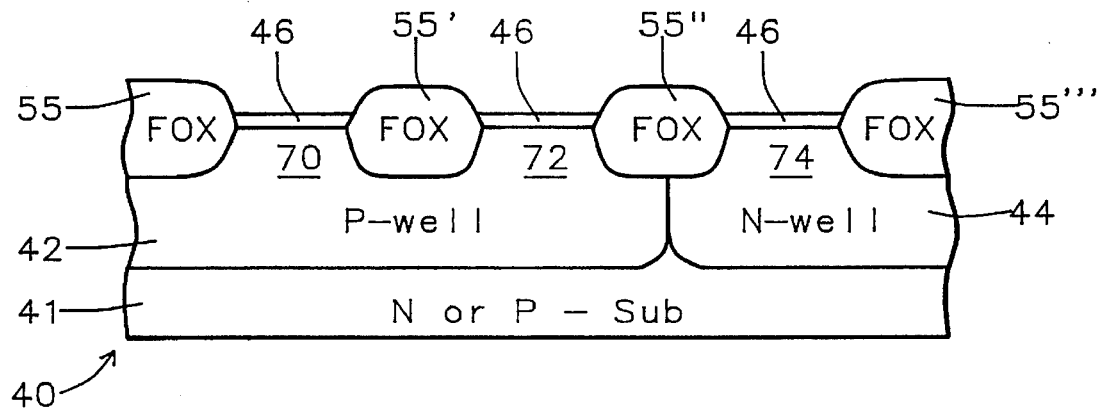
FIGS. 5A–5C show cross sectional views of a process in accordance with this invention of fabrication of another semiconductor device on a silicon substrate.
Figure 5B:
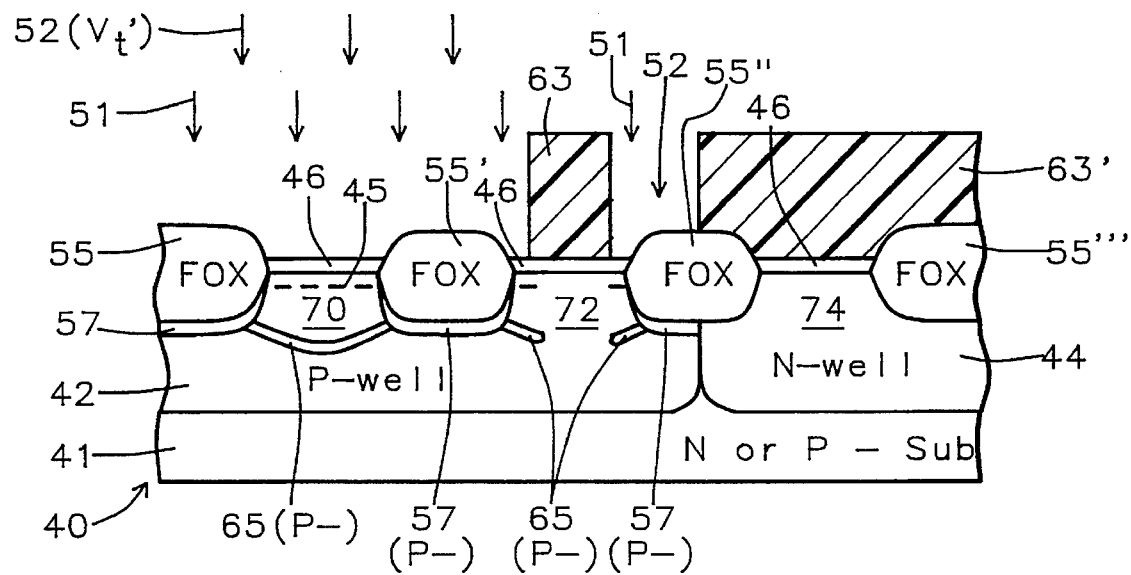
Figure 5C:
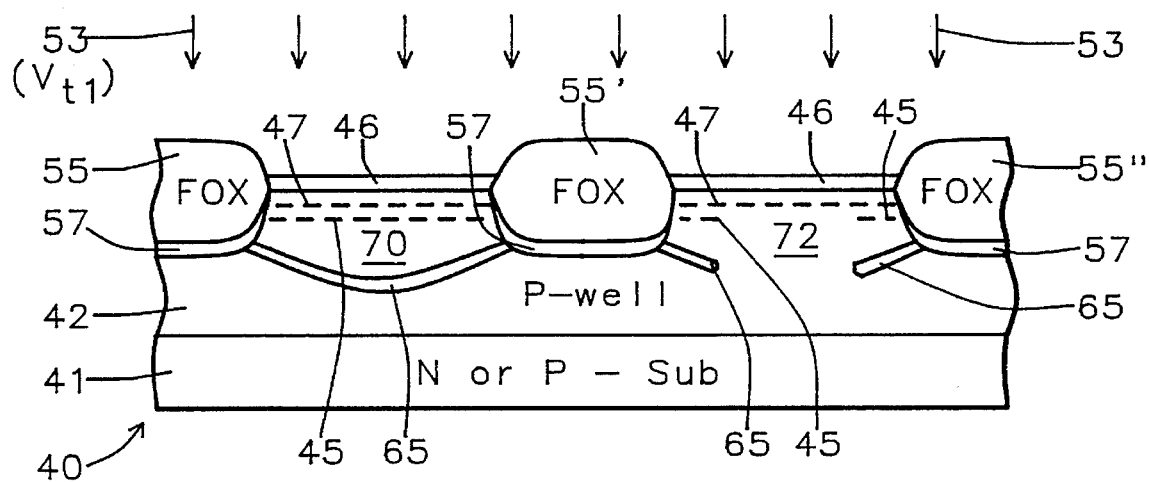

FIGS. 5A–5C show cross sectional views of a process in accordance with this invention of fabrication of another semiconductor device on a silicon substrate 40 in which a P-well 42 and an N-well 44 in an N or P-sub 41, etc. (any type of semiconductor substrate is satisfactory) have been formed by a conventional process, with only the P-well 42 shown in FIGS. 5B and 5C. P-well 42 and an N-well 44 were formed previously by a conventional process. In FIG. 5C, the N- well 44 is excluded from view for convenience of illustration since the scale of FIG. 5C is enlarged with comparison to FIGS. 5A and 5B. The same Vt1 implant is made into the N-Well active region as in prior art FIGS. 3A to 3H and 4A to 4C.

A field oxidation was previously performed leaving FOX structures 55, 55', 55" and 55"" as shown in FIG. 5A. In the region 70 in the P-well 42 between one pair of FOX structures 55 and 55', the surface of the silicon dioxide (Pad oxide) 46 is exposed and in another region 72 in the P-well 42 between FOX structures 55' and 55" is mostly covered by mask 63.

In FIG. 5B, NMOS photoresist mask 63 has been formed over the N-well 14 portions of the product of FIG. 5A between one pair of FOX structures 55" and 55"". In addition, unlike FIG. 4B a supplemental photoresist mask 63' comprising a "$V_t$'" photoresist mask is formed above the right side of the P-well 42. In the region 70 in the P-well 42 between one pair of FOX structures 55 and 55', the surface of the gate oxide 46 is exposed and in another region 72 in the P-well 42 between FOX structures 55' and 55" is mostly covered by mask 63. Since the mask 63 is also formed over a portion of the P-well 42, it forms a different threshold device. For example, referring to FIGS. 2A and 2B, device 72 receives a $V_{t1}$ implant and device 70 receives the combination of a $V_{t1}$ implant and $V_t$' implant, so the threshold $V_t$ is different.

Then a field implantation of B$^{11}$ dopant ions 51 at 120 keV to about 200 keV is made into regions 70 and 72 in the P-well 42. A dose of ions 57 is formed under the FOX regions 55, 55' and 55", where they are exposed and the ions in regions 70 and 72 reach deep into the P-well 42 in the active region due to the high energy. Ions 65 are injected deep in the active region due to the higher energy of a field implantation 51. In this process, the exposed region is implanted with a threshold implantation $V_t$' of dopant 52.

Note that it is critical that the mask 63 over the region 72 the P-well 42 is undersized compared to the masks employed in FIGS. 3G and 3H and FIG. 4C with the two mask process to permit the P- field to stay under the FOX region to prevent leakage. There are P- regions 57 beneath FOX structures 55, 55', 55" formed during ion implantation Vt' 51 because 120 keV to about 200 keV can extend through the field oxide structures.

Following the field implantation, a $V_t$' dopant 52 is applied at a preferred dose of 2×10E12 cm$^{-2}$ of B$^{11}$ or BF$_2$ dopant at a preferred energy of 20 or 60 keV, respectively, to provide a far higher level of doping. A range of energies from about 10 keV to about 80 keV is possible. A range of doses from about 5×10E11 cm$^{-2}$ to about 5×10E12 cm$^{-2}$ is possible.

In FIG. 5C, the product of FIG. 5B has a $V_{t1}$ blanket ion implantation of ions 53 performed thereon, again yielding two levels of threshold voltage. The $V_{t1}$ blanket dopant is applied at a preferred dose of about $3.5 \times 10E12$ cm$^{-2}$ of BF$_2$ dopant at a preferred energy of 60 keV to provide a far higher level of doping. A range of energies from about 10 keV to about 80 keV is possible. A range of doses from about $8 \times 10E11$ cm$^{-2}$ to about $5 \times 10E12$ cm$^{-2}$ is possible. An alternative $V_{t1}$ dopant 53 is P$^{31}$ or As+ with a range of energies from about 30 keV to about 120 keV and a range of doses from about $5 \times 10E11$ cm$^{-2}$ to about $5 \times 10E12$. In the region 70 there is a $V_t$ dose of ions where $V_t = V_{t1} + V_t'$, which is different from $V_{t1}$, which is the value in region 72 which was under the supplemental photoresist mask 63 with the single masking layer in FIG. 5B.

Figure 6A:
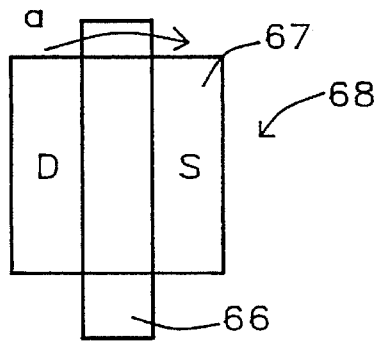
FIG. 6A shows a polysilicon gate over an active area with a source S and a drain D.

FIG. 6A shows a polysilicon gate 66 over an active area 67 with a source S and a drain D. A FOX region 68 is juxtaposed with the source. The NMOS field implantation is performed to form a P- layer under the P- well field oxide to increase the NMOS field threshold and to prevent the surface inversion from causing a leakage path illustrated by "a" in FIG. 6A.

Figure 6B:
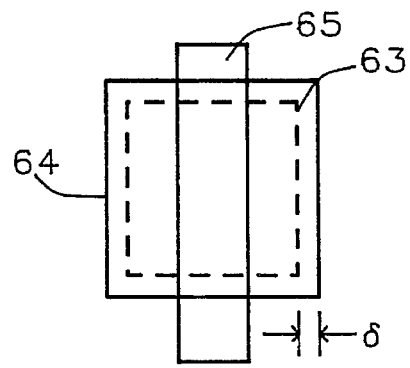
FIG. 6B shows the layout in accordance with this invention including a field implant mask smaller than the active area by the dimension δ.

FIG. 6B shows the layout in accordance with this invention including a field implant mask 63 smaller than the active area 64 by the dimension δ. This small mask design is defined herein as an Active Under Size Mask (e.g. 0.3 μm ≦ δ ≦ 1.0 μm) to mask the low threshold area, like FIG. 5B.

After the threshold implant, the steps of the standard manufacturing process follows.

The prior art process require two masking layers for the NMOS field mask and the $V_t'$ mask. On the other hand, the instant invention employs a single masking layer. Because of the reduction in the number of processing steps, the process of this invention is simple and cost effective.

An analogous product comprising a PMOS device with an N-well is equally suitable, manufactured in accordance with the process of this invention.

In summary, referring to FIG. 5B it is critical that the mask 63 over the region 72 the P-well 42 is undersized as compared to the masks employed in FIGS. 3G and 3H and FIG. 4C with the two mask process. The undersized mask permits merging the P-well field mask and Vt' mask.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor MOSFET device including a doped semiconductor substrate with a P-well and an N-well and field oxide structures on the surface of said P-well and said N-well separating the surfaces of said P-well and said N-well into separate regions and a silicon dioxide film on the reminder of the surface of said P-well and said N-well comprising:

an additional field oxide structure having two sides formed on the surface of said P-well, a field implant, lightly doped, P- region deeply implanted in said substrate extending across said P-well in; region from one side of said additional field oxide structure to one of said field oxide structures, a field implant lightly doped P- region deeply implanted in said P-well from the other side of said additional field oxide structure extending to another of said field oxide structures with a gap where said lightly doped P- region is absent between said other side of said of said additional field oxide structures and said another field oxide structure, with said lightly doped field implant region deeply implanted below all said field oxide structures in said P-well in said substrate, field ion implanted regions of $V_t'$ ions in said P-well, a blanket ion implanted region of $V_{t1}$ ions in said entire device.

2. A device in accordance with claim 1 wherein said $V_t'$ ions are selected from the group consisting of B$^{11}$ and BF$_2$ with a dose between about $5 \times E11$ cm$^{-2}$ and about $5 \times E12$ cm$^{-2}$.

3. A device in accordance with claim 1 wherein said $V_{t1}$ ions consist of BF$_2$ with a dose between about $8 \times E11$ cm$^{-2}$ and about $5 \times E12$ cm$^{-2}$.

4. A device in accordance with claim 2 wherein said $V_{t1}$ ions consist of BF$_2$ with a dose between about $8 \times E11$ cm$^{-2}$ and about $5 \times E12$ cm$^{-2}$.

5. A device in accordance with claim 1 wherein said $V_{t1}$ ions are selected from the group consisting of P$^{31}$ and As+ and with a dose between about $5 \times E11$ cm$^{-2}$ and about $5 \times E12$.

6. A device in accordance with claim 2 wherein said $V_{t1}$ ions are selected from the group consisting of P$^{31}$ and As+ and with a dose between about $5 \times E11$ cm$^{-2}$ and about $5 \times E12$.

7. A device in accordance with claim 3 wherein said $V_{t1}$ ions are selected from the group consisting of P$^{31}$ and As+ and with a dose between about $5 \times E11$ cm$^{-2}$ and about $5 \times E12$.

8. A device in accordance with claim 4 wherein said $V_{t1}$ ions are selected from the group consisting of P$^{31}$ and As+ and, with a dose between about $5 \times E11$ cm$^{-2}$ and about $5 \times E12$.

9. A device in accordance with claim 1 wherein said field implant comprises B$^{11}$ dopant.

10. A device in accordance with claim 2 wherein said field implant comprises B$^{11}$ dopant.

11. A device in accordance with claim 3 wherein said field implant comprises B$^{11}$ dopant.

12. A device in accordance with claim 4 wherein said field implant comprises B$^{11}$ dopant.

13. A device in accordance with claim 5 wherein said field implant comprises B$^{11}$ dopant.

14. A device in accordance with claim 6 wherein said field implant comprises B$^{11}$ dopant.

15. A device in accordance with claim 7 wherein said field implant comprises B$^{11}$ dopant.

16. A semiconductor MOSFET device formed on a doped semiconductor substrate with a P-well and an N-well and field oxide structures on the surface of the P-well and the N-well separating the surfaces of the P-well and the N-well into separate regions and a silicon dioxide film on the remainder of the surface of the P-well and the N-well, an additional field oxide structure having two sides formed on the surface of said P-well, a field implant, lightly doped P- region deeply implanted in said substrate extending across said P-well in a region from one side of said additional field oxide structure to one of said field oxide structures, a field implant lightly doped P- region deeply implanted in said substrate across said P-well on the other side of said additional field oxide structure extending to another of said field oxide structures with a gap where said lightly doped P- region is absent between said other side of said additional field oxide structure and said another field oxide structure, with said lightly doped field implant region deeply implanted below all said field oxide structures in said P-well in said substrate, a field ion implanted region of $V_t'$ ions in said P-well implanted through a mask over the N-well and having been implanted through an under sized mask over one of the separate regions of the P-well, and a blanket ion implanted region of $V_{t1}$ ions in said entire device.

17. A device in accordance with claim 16 wherein said $V_t'$ ions are selected from the group consisting of $B^{11}$ and $BF_2$ with a dose between about $5 \times E11$ cm$^{-2}$ and about $5 \times E12$ cm$^{-2}$.

18. A device in accordance with claim 17 wherein said $V_{t1}$ ions consist of $BF_2$ with a dose between about $8 \times E11$ cm$^{-2}$ and about $5 \times E12$ cm$^{-2}$.

19. A device in accordance with claim 18 wherein said field implant comprises $B^{11}$ dopant.

20. A device in accordance with claim 16 wherein said $V_{t1}$ ions are selected from the group consisting of $P^{31}$ and As+ and with a dose between about $5 \times E11$ cm$^{-2}$ and about $5 \times E12$.

\* \* \* \* \*